US012715490B2

(12) United States Patent
Dorsch et al.

(10) Patent No.: US 12,715,490 B2
(45) Date of Patent: Aug. 25, 2026

(54) METHOD AND SYSTEM FOR DETERMINING THE ENERGY CONSUMPTION OF A RAIL VEHICLE

(71) Applicant: Siemens Mobility GmbH, Munich (DE)

(72) Inventors: Alexander Dorsch, Nuremberg (DE); Bernd Vangermain, Erlangen (DE); Martin Jung, Erlangen (DE); Tobias Weis, Hausen (DE)

(73) Assignee: Siemens Mobility GmbH, Munich (DE)

( * ) Notice: Subject to any disclaimer, the term of this patent is extended or adjusted under 35 U.S.C. 154(b) by 43 days.

(21) Appl. No.: 18/878,233

(22) PCT Filed: Jun. 2, 2023

(86) PCT No.: PCT/EP2023/064831
§ 371 (c)(1),
(2) Date: Dec. 23, 2024

(87) PCT Pub. No.: WO2023/247158
PCT Pub. Date: Dec. 28, 2023

(65) Prior Publication Data
US 2025/0381996 A1 Dec. 18, 2025

(30) Foreign Application Priority Data
Jun. 21, 2022 (DE) ..................... 10 2022 206 182.9

(51) Int. Cl.
*B61L 27/60* (2022.01)
*B61L 27/50* (2022.01)
*G01R 22/06* (2006.01)

(52) U.S. Cl.
CPC ............... *B61L 27/60* (2022.01); *B61L 27/50* (2022.01); *G01R 22/06* (2013.01)

(58) Field of Classification Search
None
See application file for complete search history.

(56) References Cited

U.S. PATENT DOCUMENTS 4,440,015 A * 4/1984 Hann .................... B60T 17/228 73/39
10,207,724 B2 2/2019 Frenzke et al.
2017/0313330 A1 11/2017 Frenzke et al.

FOREIGN PATENT DOCUMENTS

CN 101825520 A 9/2010
CN 110018002 A 7/2019
(Continued)

OTHER PUBLICATIONS

Rick Frank, et al., Zug- und Bremskraftermittlung mittels Online-Fahrwiderstandsmessung, Elektrische Bahnen, pp. 120-124, V. 101, R. Oldenbourg Verlag.
(Continued)

*Primary Examiner* — Peter D Nolan
*Assistant Examiner* — Michael F Whalen
(74) *Attorney, Agent, or Firm* — Laurence A. Greenberg; Werner H. Stemer; Ralph E. Locher

(57) ABSTRACT

A method determines the energy consumption of a rail vehicle during a test drive. The method includes: a) providing a locomotive system having a brake locomotive component and a test locomotive component, b) providing a test route, c) providing basic data for the test drive having information about the train composition, load, route profile and timetable, d) determining driving data from the basic data, and transmitting the driving data to the control system, e) determining braking data from the basic data, and transmitting the braking data to the control system, f) carrying out the test drive with the locomotive system on the test route and measuring the energy consumption of the test locomotive component while this is controlled in accordance with
(Continued)

the driving data and is simultaneously braked by the brake locomotive component in accordance with the braking data. A corresponding system is provided for implementing the method.

19 Claims, 1 Drawing Sheet

(56) References Cited

FOREIGN PATENT DOCUMENTS

| | | | |
|---|---|---|---|
| CN | 110553864 | A | 12/2019 |
| DE | 69219272 | T2 | 9/1997 |
| EP | 3312073 | A1 | 4/2018 |
| EP | 3760511 | A1 | 1/2021 |

OTHER PUBLICATIONS

Brauer Hans-Martin, et al., HellasSprinter—erste elektrische Lokomotive für Griechenland, Elektrische Bahnen, pp. 107-114, V. 96, R. Oldenbourg Verlag.

* cited by examiner

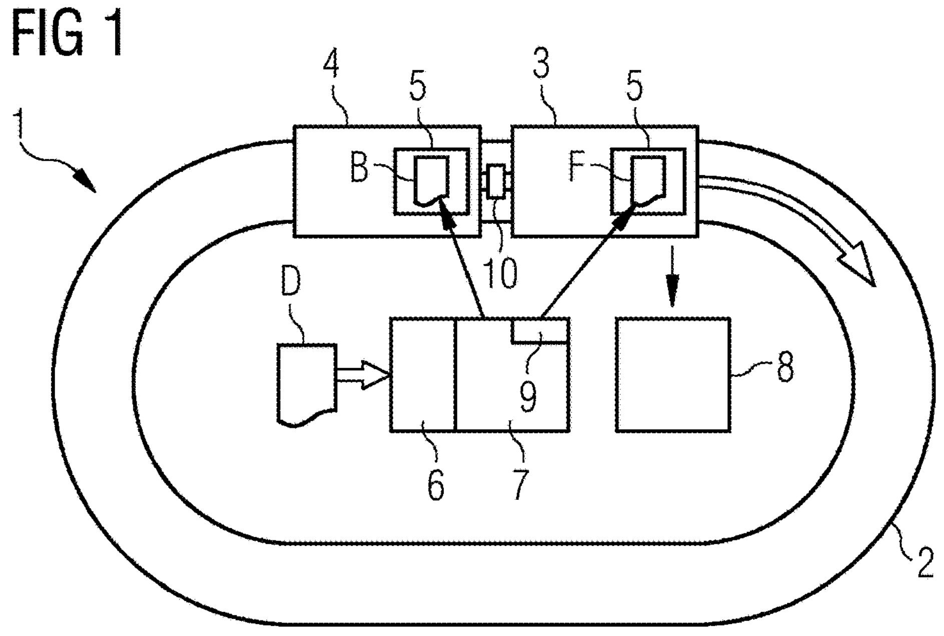
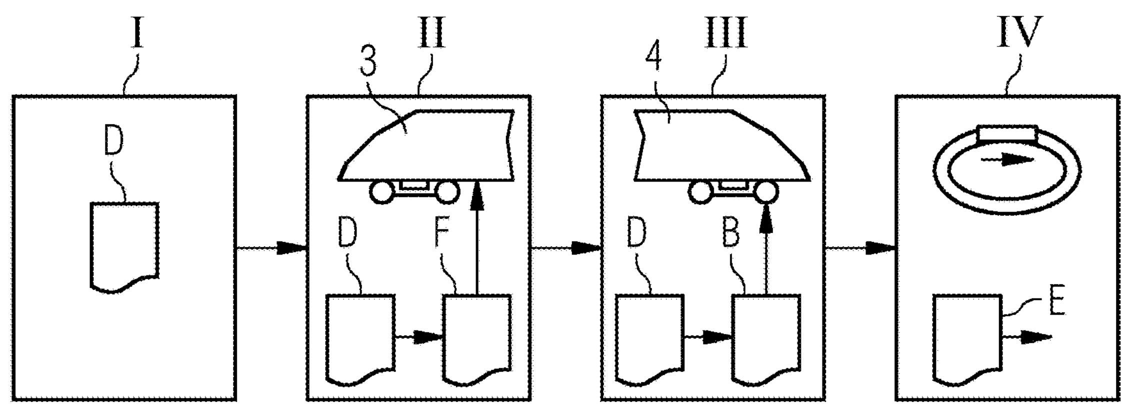
FIG 3
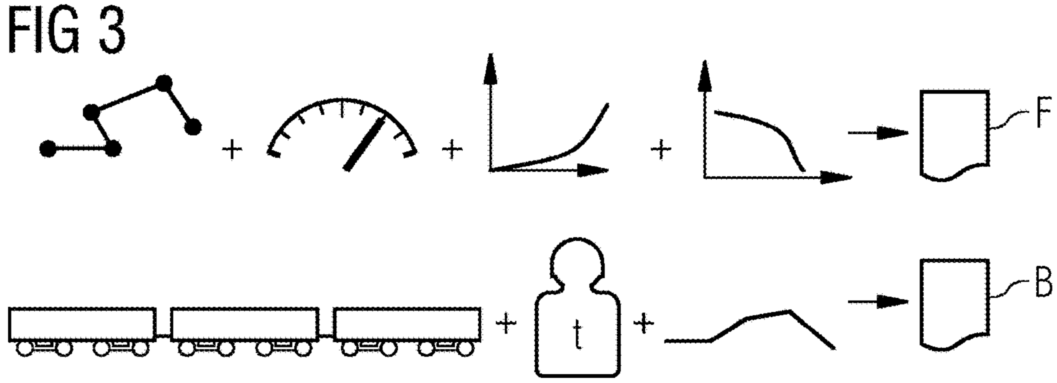

METHOD AND SYSTEM FOR DETERMINING THE ENERGY CONSUMPTION OF A RAIL VEHICLE

FIELD AND BACKGROUND OF THE INVENTION

The invention relates to a method and a system for determining the energy consumption of a rail vehicle, such as a locomotive or a wagon, during a test run. In particular, the invention provides that any combination of train configuration, tracks and timetables can be simulated realistically with a test setup.

Due to increased sensitivity to energy consumption, greater emphasis is increasingly being placed on minimizing or accurately estimating it. It may be the case that an expected energy consumption is calculated in advance for certain tracks with specified timetables for both passenger and freight transport during the bidding phase and assured by vehicle suppliers. When an order is placed during the course of the project, proof of a calculated value for the energy consumption of a vehicle on the real track is often also required, for which purpose a planned train configuration is run on the real track under real conditions, e.g. loading of the wagons to simulate passengers or freight. During the journey, the energy requirement is measured and compared with the calculated value. Deviations between the agreed and measured values, which would mean additional consumption by the vehicle, are penalized with sometimes high contractual penalties.

One disadvantage of the methods used for this is that several processes and work steps are very time and cost intensive and also introduce uncertainty into the calculation and measurement and thus a higher risk into the project.

(a) The real track must be booked and kept free for several test runs, wherein it is always possible that the run may have to be interrupted or, in the worst case, canceled due to operational disruptions, etc. A train driver (often abbreviated to "Td") who is familiar with the track must also be available.

(b) Providing the real train configuration is often complicated, as the vehicles either have to be taken out of active operation or the vehicles are otherwise difficult to obtain, as the evidence often has to be provided in earlier phases of the project and the vehicles may not yet have been manufactured or cannot be called up from customer stocks.

(c) Verifications with passenger carriages usually have to be carried out with a specified seat occupancy. Depending on the number of wagons and the occupancy to be simulated, the loading process can cause extremely high costs. For freight wagon verifications, a representative load must also be sufficiently well planned.

(d) The driving style of the train driver, e.g. how strongly and for how long train accelerates and brakes, has an extremely high influence on energy consumption. It is very difficult for the driver to exactly reproduce the traction force curves used in the calculation in reality. It is just as difficult to take into account the exact driving behavior of a driver in the calculation. The deviation between the calculation and the implementation in the measurement run can therefore sometimes be very large.

(e) The boundary conditions of the calculation, such as grid voltage, headwind or outside temperature, are often precisely specified in the tender. These conditions are often dependent on the environment or the infrastructure and can hardly be controlled on a real track. The main factors influencing the test run and its result during normal operation are tunnel driving and oncoming traffic, as these have an influence on the running resistance, operational disruptions, as these can hinder the intended schedule or the entire measurement, fluctuating grid voltage, e.g. due to oncoming traffic, as this affects the efficiency of the vehicle, weather events such as wind, which increases the running resistance and thus also the energy requirement, wherein wind is also not practicable to measure on the track, and rain and other weather events that can occur during the limited test time.

In the past, it was common practice to determine the energy efficiency of a locomotive on the basis of an overall efficiency at a specific operating point. An operating point is defined by a speed and a tractive force (preferably at the wheel). In the course of the tender, the respective efficiencies were calculated under certain boundary conditions, usually for several specified operating points, and contractually agreed. During the implementation of the project, each efficiency level had to be verified individually by measurement on the rails. For this purpose, the locomotives were kept constant at the operating point to be measured over a certain period of time and the power output at the wheel $P(wheel)=F*v$ (with the force F and the speed v) was compared with the power consumed via the overhead line $P(grid)=I(grid)\cdot U(grid)$ (with the current strength I(grid) and the grid voltage U(grid)). The general definition of efficiency n in this case is: $\eta=P(wheel)/P(grid)$. The efficiency must normally be specified for several operating points. Based on these efficiencies, it is possible to calculate how high the energy consumption will be for certain applications, e.g. in freight or passenger transportation.

These measurements are currently carried out on a real track with trains that have a test load or a simulated load. This is laborious, time-consuming, subject to errors and coupled with comparatively high costs.

Recently, the mathematical and metrological proof described above has often been contractually required. This inevitably makes it necessary for a vehicle supplier to determine and contractually guarantee significantly more precise energy consumption values during the bidding phase.

SUMMARY OF THE INVENTION

It is an object of the present invention to provide an alternative, more convenient method and a corresponding system for determining the energy consumption of a rail vehicle, e.g. a locomotive or a wagon, during a test run, with which the disadvantages described above can be avoided and, in particular, any combination of train configuration, tracks and timetables can be simulated realistically with a test setup.

This object is achieved by a method according to the independent method claim and a system according to the independent system claim.

The method according to the invention for determining an energy consumption of a rail vehicle, preferably a locomotive or a wagon, during a test run comprises the following steps:

a) providing a locomotive system comprising a brake locomotive component and a test locomotive component (which could also be referred to as a "running component") which are coupled together, wherein the brake locomotive component is moved by the test locomotive component during the test run, and wherein a control system controls the test locomotive component and the brake locomotive component during the test run, b) providing a test track on which the locomotive system runs during the test run, c) providing basic data for the test run, including at least information on the train composition, loading, track profile and timetable, d) determining running data from the basic data, which includes at least information on the tractive force and speed profiles of the test run and is designed to control the test locomotive component during the test run on the test track, and transmitting the running data to the control system, e) determining braking data from the basic data, which includes at least information on the inhibition during the test run by the train composition, loading and/or track profile, and is designed to brake the brake locomotive component during the test run on the test track in accordance with the inhibition, and transmitting the braking data to the control system, f) carrying out the test run on the test track and measuring the energy consumption of the test locomotive component while it is controlled according to the running data and simultaneously braked by the brake locomotive component according to the braking data.

The determination of an energy consumption is therefore carried out during a test run on a test track. Even if a (closed) real track can theoretically be used as a test track, it is preferable that the test run is carried out on a track specially designed as a test track, e.g. on a straight track or in a circle. This allows ideal laboratory conditions to be created and environmental influences to be taken into account or suppressed very precisely.

The rail vehicle for which the energy consumption is to be measured can be a powered rail vehicle, e.g. a locomotive, a multiple unit or a railcar of which the energy consumption is being measured. However, it can also be a non-powered rail vehicle, e.g. a wagon. In this case, the measured energy consumption is that which must be expended for the movement of the non-powered rail vehicle.

The locomotive system with brake locomotive component and test locomotive component preferably does not include any other locomotives or wagons, wherein on the other hand, however, wagons to be measured could also be coupled. During the test run, the brake locomotive component preferably simulates the wagons (or other wagons), their load and preferably also a track, e.g. the real track on which the rail vehicle is to be used later. It is also preferable to simulate wagons to be measured (possibly without simulating a track). The brake locomotive component is then pulled or pushed by the test locomotive component during the test run.

Even if a locomotive is preferably used as a "test locomotive" component and another locomotive is used as a "brake locomotive" component, these components can also be realized in a single locomotive, e.g. in which one powered bogie in the locomotive is used as a test locomotive component and another as a brake locomotive component. In a multiple unit train, one drive unit (in particular the front one) could be used as a test locomotive component and another drive unit (in particular the rear one) as a brake locomotive component. In the case of a multiple unit train, it can also be advantageous if there are wagons between the test locomotive component and the brake locomotive component, as a complete multiple unit train can then be used for the test run without modifications.

Suitable control units for controlling the test locomotive component and the brake locomotive component during the test run are known. For example, control units can be used to automatically control a locomotive or traction units, as they are currently already in use. The control system can then be provided by control units of the test locomotive component or the brake locomotive component. However, a control system can also be used which controls the components jointly, e.g. by direct action on the control units of the two components (e.g. of locomotives), e.g. by radio or, in the case of an onboard system, by means of a cable connection.

The test track should be as simple and flat as possible. Circular tracks are particularly suitable, which possibly also consist of two circular halves connected to each other by straight sections to form a ring. The simpler the shape of the test track and the larger the curve radius, the more accurate the results of the procedure will be. As already mentioned, a real track can theoretically also used as a test track, e.g. for testing a wagon configuration.

The basic data for the test run form the basis for the simulation of a real train journey. It must at least include information on the train composition, i.e. how many wagons are to be simulated, what type of wagons they are and, in particular, what running resistance (e.g. rolling resistance and/or wind resistance) they have. Basically, data that provide information on how much power is required to pull the number of wagons at certain speeds and track profiles (ascents, levels, descents) is preferred here. An example of train composition information could be a list of the desired wagons and a two-dimensional function P(v, S) or corresponding list of values for each wagon, indicating the power (or tractive effort) P required when the wagon is pulled at speed v on a line with gradient S, wherein a negative S would correspond to a descent. However, train composition information could also include a summarized function (or said list of values) P(v, S) specifying the power for a speed v and a gradient S for a whole train of wagons.

The basic data for the test run also includes information on the loading. This can be available separately from the train composition information or combined with it. Separating the two types of information has the advantage that the loading can be changed independently of the train configuration during several test runs.

It is important that the basic data includes information on the track profile, i.e., where exactly there are ascents, levels or descents and how large the curve radii are, and on the timetable, i.e., at what speed the train travels on the track and when, when it brakes and when it accelerates. The running data are important for operating the test locomotive component. They should correspond to a real journey of the test locomotive component on the simulated track and are designed to control the test locomotive component during the test run on the test track. Basically, the generation of running data is known in the prior art and typically includes information on tractive force and speed profiles (i.e., accelerations, braking and stops). The running data are derived from the basic data, in particular from the information on the timetable and possibly also from the track profile.

The running data are then transmitted to the control system (for the test locomotive component), in particular to a control unit of the test locomotive component.

The braking data are important for operating the brake locomotive component and are used to simulate a real or at least a desired track and possibly other obstacles such as wagons. They include at least information on the inhibition during the test run due to the train composition, loading and/or track profile and are designed to brake the brake locomotive component during the test run on the test track in accordance with this inhibition. In the case where a test run is to be simulated on a real or desired track, the braking data should include the obstacles on this track. In the case only the effects of a car configuration on energy consumption are to be measured (especially in the case of a test run on a real track), it is not absolutely necessary for the braking data to include data on the obstacle of a track. In the example described above, where the train composition (here preferably together with the load for the sake of simplicity) is specified with a two-dimensional function for the power P(v, S), the gradient S from the track profile and the speed v from the timetable can simply be used. Of course, this should occur in such a way that the timetable is synchronized with the track profile at every position of the simulated track. The power curve generated from this for the entire track can then be converted into braking data. Basically, the braking data are similar to the power curve. The greater the power to be applied, the greater the braking must be and vice versa. Of course, this is only an example; a mathematical function for braking B(v, S) can also be present in the basic data (e.g. instead of the power data) and a braking curve can be calculated directly using the timetable and the track profile. It should be noted that the braking data could also be negative, i.e., cause an acceleration such as occurs on a downhill section.

The braking data are then transmitted to the control system (for the brake locomotive component), in particular to a control unit of the brake locomotive component.

If the running data and the braking data are available, a test run can be carried out on the test track with the locomotive system. The test locomotive component is controlled according to the running data and simultaneously braked by the brake locomotive component according to the braking data. The energy consumption is then measured during the test run. The special control of the brake locomotive component simulates a journey on a track (which is different from the test track and can correspond to a real track) with a train selected from the test locomotive component and a number of wagons during the measurement.

The measurement can then be used directly for the energy consumption of a rail vehicle in the form of a locomotive to be tested or it can be used to measure a wagon as a rail vehicle.

In this way, the method according to the invention can be used to simulate any combination of train configuration, track or topography and timetable with two locomotives on an arbitrary test track. It should be noted that characteristics of the test track can also be included in the basic data and incorporated into the braking data. This allows (positive or negative) gradients or curve radii of the test track to be compensated for and the influence of the test track on the measurement to be eliminated.

In other words, the operational cycle to be tracked is calculated using a train composition, track and timetable in such a way that a braking force profile (the braking data) and a tractive force profile (the running data) are created. The tractive force profile is applied, for example, to the locomotive to be measured ("test locomotive component"), the other to the coupled brake locomotive component (e.g. a brake locomotive), wherein the two components or locomotives can also be controlled by means of a common control system if necessary. The braking force profile of the brake locomotive component is selected in such a way that the profile to be run off reflects the running resistances of the track and the train composition. The locomotive to be measured runs the driving profile in the same way as a train driver would under operational conditions. In other words, the real operational cycle is preferably prepared and loaded onto two coupled locomotives in the form of driving profiles so that the real conditions (train configuration, track and its topography, timetable) can be simulated on the, preferably ring-shaped, test track.

The invention eliminates the need to rent and keep free real tracks in normal operation, as the test runs can basically be carried out on any test track (test ring) (including the company's own). This gives the project maximum flexibility with regard to the location, time and duration of the test runs.

With the method according to the invention, basically any train configuration can be simulated and used for measurement. This is independent of whether the real vehicles (in particular wagons are meant here) are available or, for example, have not yet been produced in the tender phase and are only available as a digital model. In addition, the loading of the vehicles is now only represented as a parameter in the operational cycle calculation and can be adjusted without effort. There is no longer any need to load the vehicle configuration manually.

The driving profiles (running data and braking data), which are uploaded to both locomotives, provide a reproducible driving behavior of the test locomotive component. This reduces the deviation from calculation to measurement to a minimum, which also significantly reduces the project risks.

Running on a closed test track (test ring) offers many advantages compared to the real track. For example, the grid voltage can be controlled individually, there is no unplanned oncoming traffic, tunnel driving and operational disruptions are also very unlikely. It is also possible to react to weather events by flexibly carrying out the measurement if there is a massive deviation from the agreed boundary conditions. Events such as headwinds are less significant on a ring-shaped test track in the test area, which are usually designed as a circle, and can also be recorded more accurately than on a real track by the measuring stations installed on site if required.

The system according to the invention for determining an energy consumption of a rail vehicle, in particular a locomotive, a railcar, a multiple unit or a wagon, during a test run is suitable and in particular designed to apply the method according to the invention. The system comprises the following components:

- in the case where the rail vehicle to be measured is a non-powered rail vehicle (e.g. a wagon), a locomotive system comprising a test locomotive component, in particular a test locomotive, and a brake locomotive component, in particular a brake locomotive, and in the case in which a powered rail vehicle is to be measured as the rail vehicle, a brake locomotive as the brake locomotive component with a coupling with which it can be coupled to a locomotive system for a test run with the powered rail vehicle as the test locomotive component,
- a control system designed to control the brake locomotive component and the test locomotive component, and preferably comprising at least one control unit for the brake locomotive component, and an interface for data transmission to the test locomotive component,
- a test track on which the locomotive system runs during the test run, a data interface designed to receive basic data for the test run comprising at least information on the train composition, loading, track profile and timetable, a determination unit designed to i) determine running data from the basic data, which includes at least information on the tractive force and speed profiles of the test run and is designed to control the test locomotive component during the test run on the test track, ii) determine braking data from the basic data, which includes at least information on the inhibition during the test run by the train composition, loading and/or track profile, and is designed to brake the brake locomotive component during the test run on the test track in accordance with the inhibition, iii) transmit the running data and braking data to the control system, wherein the braking data are provided for braking the brake locomotive component and the running data for controlling the test locomotive component, a measuring unit designed to measure the energy consumption of the test locomotive component while it is controlled on a test run with the locomotive system on the test track in accordance with the running data and simultaneously braked by the brake locomotive component in accordance with the braking data.

The system does not necessarily have to include the test locomotive component, as this can basically be interchangeable. Rather, it is designed for testing any rail vehicles, e.g. test locomotives, wherein a test locomotive that is currently being tested simply has to be coupled to the brake locomotive (as a brake locomotive component) of the system for a test run on the test track. For this purpose, the brake locomotive component has a coupling, in particular a universal coupling, with which it can be coupled to a locomotive system for a test run with the test locomotive component.

However, in the case where a wagon is to be measured, the system must include a test locomotive component, as the wagon must be pulled. In this case, it is preferable to measure the test locomotive component first and then the wagon, so that the influence of the test locomotive component on the result can be eliminated.

The control system is designed to control the locomotive system. This can be achieved in particular by the control system being able to control both the test locomotive component and the brake locomotive component, e.g. as a higher-level control system or by transmitting the running data to a control unit of the test locomotive component. In practice, it can be a control system that has at least one control unit for the brake locomotive component and an interface for transmitting data to the test locomotive component.

The test track has already been described above.

The data interface can, for example, be designed for data communication by radio and thus, for example, to receive basic data from a control center for the test run. These basic data have already been described above.

The determination unit determines running data for the test locomotive component and braking data for the brake locomotive component and sends these to the corresponding locomotive. How exactly these running data and braking data are determined has already been described above. The transmission of the running data and braking data to the control system can take place in different ways, depending on how the control system is structured. The control system can be a higher-level system that is capable of in dependently controlling a test locomotive component (or a test locomotive). However, it can also simply send the running data to the test locomotive component, which is then controlled by its own control unit in accordance with the running data. This transmission of running data is also regarded as a type of control in the sense of the invention, since the test locomotive component moves according to this running data during the test run. In the case where the control system is a higher-level system, running data are sent to the control system, and the control system controls the test locomotive component (e.g. a test locomotive) accordingly. In the event that the test locomotive component is indirectly controlled by the control system, the test locomotive component (e.g. a test locomotive) receives the running data via a preferred data interface to its own control unit. The brake locomotive component (e.g. a brake locomotive) preferably receives the braking data on its own control unit (which is preferably part of the control system) and brakes according to these braking data.

The measuring unit works as described above and measures the energy consumption of the test locomotive component during the test run.

In particular, the invention can be realized in the form of a computer unit, especially in a control device, with suitable software. The computer unit can, for example, have one or more cooperating microprocessors or the like for this purpose. In particular, it can be realized in the form of suitable software program parts in the computer unit. A largely software-based realization has the advantage that even computer units already used in train sets or train combinations or in their wagons can be easily upgraded by a software or firmware update in order to work in the manner according to the invention. In this respect, the object is also achieved by a corresponding computer program product with a computer program which can be loaded directly into a memory device of a computer unit, with program sections to carry out all the steps of the method according to the invention when the program is executed in the computer unit. In addition to the computer program, such a computer program product may comprise additional components such as documentation and/or additional components, including hardware components such as hardware keys (dongles, etc.) for using the software. A computer-readable medium, for example a memory stick, a hard disk or another transportable or permanently installed data carrier, on which the program sections of the computer program that can be read in and executed by a computer unit are stored, can be used for transport to the computer unit and/or for storage on or in the computer unit.

Further, particularly advantageous embodiments and developments of the invention result from the dependent claims and the following description, wherein the claims of one claim category can also be further developed analogously to the claims and description parts to form another claim category and, in particular, individual features of different exemplary embodiments or variants can also be combined to form new exemplary embodiments or variants.

According to a preferred method, special basic data are used. This basic data comprise the running resistances of the vehicles (in particular wagons) that are used in the train composition or are to be simulated. These running resistances comprise at least one of the traction, weight and air resistance of the vehicles used. Alternatively or additionally, the basic data preferably specify a scenario that has impaired running characteristics compared to normal operation, and in particular includes a maximum load and/or low grid voltage and/or headwind. Since the energy consumption under worst-case conditions is often of interest, these events that affect the journey can be included in the basic data and influence the braking data accordingly.

According to a preferred method, the test locomotive component is a test locomotive and the brake locomotive component is a brake locomotive, or a test locomotive component is used as the test locomotive component and a brake locomotive component is used as the brake locomotive component. In this case in particular, the control system comprises two control units. The test locomotive component (i.e., preferably the test locomotive) has its own control unit, to which the running data are transmitted and which is designed to control the test run of the test locomotive component in accordance with the running data. The brake locomotive component (i.e., preferably the brake locomotive) has its own control unit to which the braking data are transmitted and which is designed to brake the brake locomotive component during the test run in accordance with the braking data. Since most locomotives or drive units include such control units, such a control system is very easy to implement. Basically, there simply has to be a data communication in which the braking data are sent to the control unit of the brake locomotive component and the running data are sent to the control unit of the test locomotive component. It would also be advantageous if both control units could be synchronized. A simple solution would be to determine the position on the simulated track.

Basically, any track can be used as a test track, especially if its properties are known, although this does not necessarily need to be the case when measuring wagon configurations. In a case where only the wagons are to be simulated by the brake locomotive component, a completely normal track can, theoretically, be used as a test track.

According to a preferred method, however, the test track has a closed track and is preferably ring-shaped, in particular circular. Particularly preferably, it comprises curves and straight sections, especially two circular halves, which together with parallel, straight sections form a ring.

According to a preferred method, the braking data are such that the driving profile of the brake locomotive component can be controlled during the test run in such a way that running resistances of a predetermined track and a predetermined train composition are mapped. The running data are preferably such that the driving profile of the brake locomotive component can be controlled during the test run in such a way that a predefined driving profile is mapped. The mapped driving profile should correspond to a driving profile that a locomotive driver would use under operational conditions, i.e., a normal journey.

Preferably, the control of the test locomotive component and brake locomotive component is synchronized in such a way that a predefined driving profile is applied at predefined track positions during a simulated journey on a simulated track. Looking at the simulated track, this means that the test locomotive component and brake locomotive component should be at the same position at the same time so that the running data and brake data are applied synchronously.

According to a preferred method, the braking data are such that they simulate non-powered rail vehicles attached to the test locomotive component, in particular freight wagons and/or passenger wagons, wherein the running resistances of the vehicles are determined in particular by means of numerical fluid mechanics (the term computational fluid dynamics, CFD, is often used). The running resistances of wagons are therefore included in the braking data, which are fully simulated. The real wagons do not yet have to exist. This means that new wagon types can also be simulated in a targeted manner.

According to a preferred method, the test track preferably comprises its own controllable power supply. This enables a clearly predetermined variation of the voltage during the test run. The test run is then carried out with a predetermined grid voltage, wherein the grid voltage is varied according to a predetermined profile during the test run.

According to a preferred method, environmental conditions, in particular wind and/or temperature, are measured during the test run. The measured energy consumption is then preferably adjusted depending on this measurement. On a circular track, the problem with wind is not serious, as the wind blows from all sides as seen from the locomotive system on a circular track. However, a real journey on a real track is mapped on the circle, so that different speeds could be driven within one circuit. As the wind resistance is speed-dependent, but this dependency is known or can at least be determined, the influence of wind on the test run can be factored out. The effects of temperature, e.g. the energy consumption of the cooling system, can also be factored out.

According to a preferred method, the test run is carried out several times. Preferably, the running data and/or the braking data are varied according to a predefined scheme for different test runs. This has the advantage that a "smearing" of the test data is achieved, which represents greater certainty for the final result. For a customer, the highest energy consumption can then be specified as the final result to be on the safe side. It is preferred that the variation of the braking data simulates oncoming traffic and/or tunnel driving and/or weather events, in particular wind. Preferably, the variation of the running data simulates disruptions in the operating sequence and/or deviations from driving pro files due to weather events.

According to a preferred method, the running data are varied, preferably with non-varied braking data. The energy consumption is then measured for several test runs and the test run with the most favorable energy consumption is determined. The corresponding running data for this test run is then output. In this way, it is possible to specify a default value for a locomotive run on a track for a locomotive driver. For example, for a locomotive with a battery, it is possible to determine which driving mode has the lowest energy consumption on a track. Preferably, acceleration profiles and/or braking profiles (i.e., the type of braking in the running data) and/or a control of a cooling system for drive components of the test locomotive component are varied in the running data.

This means that the invention can also be used for further investigations in addition to the pure verification of energy consumption. For example, as explained above, the customer operational cycle can also be used as a basis for specific optimizations. This means that if it is planned to operate a vehicle (the test locomotive component or a simulated wagon) on a specific track with a corresponding timetable, the vehicle or the driving style can be optimized specifically for this purpose with the help of the emulator and, for example, the cooling of the drive components can be parameterized to be as energy-efficient as possible. Especially for passenger transportation (preferably with multiple unit trains), the energy efficiency of the vehicles can be further increased.

According to a preferred method, the profile of the test track is at least included in the braking data in such a way that curve radii and, in particular, ascents and descents of the test track are compensated for. In this way, the influence of the test track on the measurements can be eliminated, as the characteristics of the test track should not influence the measurement. The test track influences the test result with its gradients, curves and any switches present. If there is a gradient on the test track, the test locomotive component must apply additional force to overcome it. These events are offset accordingly in the braking data in order to compensate for the effects of the topography of the test track.

For this purpose, it is preferable that a table or mathematical function exists in which the additional test track events are plotted as a function of the GPS position. When the corresponding position is reached, these events are included in the braking data. Instead of determining the position via GPS, the geometry of the test track can also be used to determine the position. Since test tracks are usually very flat and the curve radii are usually very large, so that their influence is comparatively small, a specially adjusted (possibly also static) controller on the brake locomotive component can also compensate for the influence of the track satisfactorily well.

According to a preferred method, the temperature of a number of components of the test locomotive component, in particular traction components, is also measured while said component is controlled according to the running data and simultaneously braked by the brake locomotive component according to the braking data. In addition to the energy consumption, the temperature of the brake locomotive component is also monitored.

With the prior art, the customer's desire for detailed verification of energy consumption cannot be optimally fulfilled. The invention offers an "operational cycle emulator" for dynamic measurements in order to examine any desired operational cycle specification metrologically with little effort. The effort involved in organizing a test run (ordering the track and vehicles, testing, train driver familiar with the track) is greatly reduced by the invention.

The concept of the operational cycle emulator according to the invention fulfills the most important aspect of metrological verification required on the market. The emulator makes it possible to analyze any desired constellation of train, track and timetable and to prepare it in such a way that the measurement run can be carried out with two locomotives on any track. Basically, only one vehicle is required for the measurement, e.g. a multiple unit, or only two vehicles are required, the test locomotive and a brake locomotive. As the characteristics of the test track (curve radii, gradients etc.) can also be simulated in the emulator by parameterization, it is possible to carry out the measurement on any available track. The driving profiles can be loaded onto both vehicles, and the preset operational cycle is run automatically, so there is no need for a train driver to intervene. This means that the specifications for the measurement run are adhered to very precisely, which greatly increases accuracy and reproducibility and makes possible re-measurements very unlikely. The test time is therefore used as effectively as possible.

Even in an early project, tender or acquisition phase without physically available vehicles (e.g. wagons), the test run can be used to show how the vehicle to be offered will behave and what energy consumption can be expected in each case. With the invention, preliminary tests with the later operational cycle can thus be realized in order to identify demanding passages in the operational cycle at an early stage before real operation and to introduce corresponding optimizations even before the first day of operation. The vehicle control, especially with regard to the cooling system, can be adapted very individually using the emulator that has been developed.

There are further possibilities for use in various type and regression tests. Here, automation can help to reduce the time and personnel required.

BRIEF DESCRIPTION OF THE FIGURES

The invention is explained in greater detail below with reference the figures provided, using exemplary embodiments. In the various figures, identical components are provided with identical reference numerals. The figures are generally not illustrative and they show:

FIG. 1 a sketch of an example of a system according to the invention from above, FIG. 2 a block diagram of an example of a method according to the invention, FIG. 3 a sketch for the generation of running data and braking data.

DETAILED DESCRIPTION OF THE INVENTION

FIG. 1 shows a sketch, from above, of an example of a system 1 according to the invention for determining the energy consumption of a test locomotive 3 during a test run. Here, the test locomotive 3 and its control unit 5 are also regarded as part of the system 1, although this is not absolutely necessary. The system can basically be used for many different test locomotives 3 but also for measuring wagons or railcars. In addition to the test locomotive 3 (as an example of a test locomotive component), the system comprises the following components:

A brake locomotive 4 (as an example of a brake locomotive component) with a coupling 10, with which it is coupled to a locomotive system 3, 4 for the test run with the test locomotive 3. Even though other wagons can also be coupled, the basic configuration shown is sufficient in principle, unless the influence of a real wagon on the test run is to be measured.

A control system 5, which is designed to control the brake locomotive 4 and test locomotive 3. Preferably, the control system 5 comprises at least one control unit 5 for the brake locomotive 4 and an interface for transmitting data to the test locomotive 3. If the test locomotive 3 is part of the system 1, the control system can be formed from the control units 5 of brake locomotive 4 and test locomotive 3.

A test track 2 on which the locomotive system 3, 4 runs during the test run.

A data interface 6 designed to receive basic data D for the test run comprising at least information on the train composition, loading, track profile and timetable.

A determination unit 7, which is designed for at least three functions, wherein these functions can be processed separately in different modules.

On the one hand, the determination unit 7 is used to determine running data F from the basic data D, which include at least information on the tractive force and speed profiles of the test run, and is designed to control the test locomotive 3 during the test run on the test track 2.

Furthermore, the determination unit 7 is used to determine braking data B, which comprise at least information on the inhibition during the test run due to the train composition, loading and track profile, and is designed to brake the brake locomotive 4 during the test run on the test track 2 in accordance with the inhibition.

Lastly, the determination unit 7 also serves to transmit the running data F and braking data B to the control system 5, wherein the braking data B are provided for braking the brake locomotive 4 and the running data F for controlling the test locomotive 3. If the control system 5 comprises the control units 5 of the two locomotives, the braking data B can be sent to the control unit 5 of the brake locomotive 4 and the running data F can be sent to the control unit 5 of the test locomotive 3.

A measuring unit 8 designed to measure the energy consumption of the test locomotive 3 while it is being controlled on a test run with the locomotive system 3, 4 on the test track 2 in accordance with the running data F and simultaneously braked by the brake locomotive 4 in accordance with the braking data B.

FIG. 2 shows a block diagram of an example of a method according to the invention for determining the energy consumption of a locomotive during a test run, e.g. with a system according to FIG. 1.

In step I, basic data D are provided for the test run, which include at least information on the train composition, loading, track profile and timetable.

In step II, running data F are determined from the basic data D, which comprise at least information on the tractive force and speed profiles of the test run and are designed to control the test locomotive 3 during the test run on the test track 2. This running data F are then transmitted to the control system 5, e.g., to the control unit 2 of the test locomotive 3.

In step III, braking data are determined from the basic data D, which comprise at least information on the inhibition during the test run due to the train composition, loading and track profile, and are designed to brake the brake locomotive 4 during the test run on the test track 2 in accordance with the inhibition. This braking data B are then transmitted to the control system 5, e.g., to the control unit 5 of the brake locomotive 4.

In step IV, a test run is carried out with the locomotive system 3, 4 on the test track 2 and the energy consumption and, if necessary, other parameters such as the temperature are measured. The energy consumption is symbolized here by the energy data E. During the measurement, the test locomotive 3 is controlled according to the running data F and simultaneously braked by the brake locomotive 4 according to the braking data B.

FIG. 3 shows a sketch of the generation of running data F (top) and braking data B (bottom). The running data F are generated from left to right from the timetable (in particular the stopping points), the travel speed of the train (in particular a speed profile), acceleration curves (how the train accelerates when starting off), deceleration curves (how the train decelerates before stopping).

The braking data B are formed from left to right from the train composition, the loading (symbolized here by a weight) and the profile of the track.

Lastly, it is pointed out once again that the methods described in detail above and the system shown are merely exemplary embodiments which can be modified by a person skilled in the art in various ways without departing from the scope of the invention. Furthermore, the use of the indefinite article “a” or “one” does not exclude the possibility that the features in question may be present more than once. Similarly, the terms “unit” and “device” do not exclude the possibility that the components in question consist of several interacting sub-components, which can also be spatially distributed. The term “a number” is to be understood as “at least one”.

The invention claimed is:

1. A method for determining energy consumption of a rail vehicle during a test run, which comprises the steps of:

a) providing a locomotive system having a brake locomotive component and a test locomotive component being coupled together, wherein the brake locomotive component is moved by the test locomotive component during the test run, and wherein a control system controls the test locomotive component and the brake locomotive component during the test run;

b) providing a test track on which the locomotive system runs during the test run;

c) providing basic data about the test run, including at least information on a train composition, loading, track profile and timetable;

d) determining running data from the basic data, the running data including at least information on a tractive force and speed profiles of the test run and are configured to control the test locomotive component during the test run on the test track, and transmitting the running data to the control system;

e) determining braking data from the basic data, which contains at least information on an inhibition during the test run due to the train composition, the loading and/or the track profile and are configured to brake the brake locomotive component during the test run on the test track in accordance with the inhibition, and transmitting the braking data to the control system; and f) carrying out the test run with the locomotive system on the test track and measuring the energy consumption of the test locomotive component while it is running according to the running data and at a same time is braked by the brake locomotive component in accordance with the braking data.

2. The method according to claim 1, wherein:

running resistances of the vehicles used in the train composition are used as the basic data; and/or the basic data specify a scenario which has impaired running characteristics compared with normal operation.

3. The method according to claim 2, wherein:

at least one variable from the group consisting of traction, weight and air resistance is used as a running resistance; and the impaired running characteristics include a maximum loading, a low grid voltage, and/or headwind.

4. The method according to claim 1, wherein:

the test locomotive component is a test locomotive;

the brake locomotive component is a brake locomotive;

the control system contains two controllers;

the test locomotive component contains a first of the two controllers, to which the running data are transmitted and which is configured to control the test run of the test locomotive component in accordance with the running data; and the brake locomotive component has a second of the two controllers, to which the braking data are transmitted and which is configured to brake the brake locomotive component during the test run in accordance with the braking data.

5. The method according to claim 1, which further comprises using a real track as the test track or the test track has a closed track guide.

6. The method according to claim 5, wherein the real track or the test track is ring-shaped and has curves and straight track sections.

7. The method according to claim 1, wherein the braking data are such that the driving profile of the brake locomotive component is controlled during the test run such that running resistances of a predetermined track and of a predetermined train composition are mapped, and the running data are such that the driving profile of the test locomotive component is controlled during the test run in such a way that a predetermined driving profile is mapped.

8. The method according to claim 7, wherein control of the test locomotive component and of the brake locomotive component proceed simultaneously in such a way that a predetermined driving profile is applied at predetermined track positions during a simulated run on a simulated track.

9. The method according to claim 1, wherein:
the braking data are such that they simulate non-powered vehicles attached to the test locomotive component; and
wherein running resistances of the vehicles are determined.

10. The method according to claim 9, wherein:
the non-powered vehicles attached to the test locomotive component are freight wagons and/or passenger wagons; and
the running resistances of the vehicles are determined by means of numerical fluid mechanics.

11. The method according to claim 1, wherein the test track has a controllable voltage supply and the test run is carried out with a predetermined grid voltage, wherein the predetermine grid voltage is varied according to a predetermined profile during the test run.

12. The method according to claim 1, which further comprises measuring environmental conditions during the test run and a measured energy consumption is adjusted in dependence on the environmental conditions measured.

13. The method according to claim 12, which further comprises measuring wind and/or temperature as the environmental conditions.

14. The method according to claim 1, which further comprises carrying out the test run several times and during different test runs the running data and/or the braking data are varied according to a predetermined scheme.

15. The method according to claim 14, wherein:
the running data are varied; and
the energy consumption is measured for several test runs, the test run with a most favorable energy consumption is determined and corresponding said running data are output for the test run.

16. The method according to claim 1, wherein the track profile of the test track is included at least in the braking data such that curve radii of the test track are compensated for.

17. The method according to claim 1, which further comprises measuring a temperature of a number of components of the test locomotive component while said components are controlled according to the running data and are simultaneously braked by the brake locomotive component in accordance with the braking data.

18. A system for determining energy consumption of a rail vehicle during a test run, the system comprising:
in a case in which a non-powered rail vehicle is to be measured as the rail vehicle, a locomotive system containing a test locomotive component and a brake locomotive component or in a case in which a powered rail vehicle is to be measured as the rail vehicle, a brake locomotive with a coupling as said brake locomotive component, and with said coupling said brake locomotive is coupled to said locomotive system for the test run with the powered rail vehicle functioning as said test locomotive component;
a controller configured to control said brake locomotive component and said test locomotive component;
an interface for data transmission to said test locomotive component;
a test track on which said locomotive system runs during the test run;
a data interface configured to receive basic data for the test run containing at least information on a train composition, loading, track profile and timetable;
a determination unit configured to:
i) determine running data from the basic data, the running data contains at least information on a tractive force and speed profiles of the test run and are configured to control said test locomotive component during the test run on said test track;
ii) determine braking data from the basic data, the braking data contains at least information on an inhibition during the test run due to the train composition, loading and/or track profile, and are configured to brake said brake locomotive component during the test run on said test track in accordance with the inhibition; and
iii) transmit the running data and the braking data to said controller, wherein the braking data are provided for braking said brake locomotive component and the running data are provided for controlling said brake locomotive component; and
a measuring unit configured to measure the energy consumption of the test locomotive component while it is controlled on the test run with said locomotive system on said test track in accordance with the running data and is simultaneously braked by said brake locomotive component in accordance with the braking data.

19. A non-transitory computer-readable storage medium containing instructions which, when executed by a computer, prompt the computer to execute at least steps c) to f) of the method according to claims 1, wherein the execution of the test run corresponding to step f) corresponds to an output of control data for controlling the locomotive system.

* * * * *